United States Patent
Chuang et al.

(10) Patent No.: US 9,159,695 B2
(45) Date of Patent: Oct. 13, 2015

(54) ELONGATED BUMP STRUCTURES IN PACKAGE STRUCTURE

(71) Applicant: Taiwan Semiconductor Manufacturing Company, Ltd., Hsin-Chu (TW)

(72) Inventors: Yao-Chun Chuang, Hsin-Chu (TW); Chita Chuang, Kaohsiung (TW); Ming Hung Tseng, Toufen Township (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 53 days.

(21) Appl. No.: 13/735,750

(22) Filed: Jan. 7, 2013

(65) Prior Publication Data

US 2014/0191391 A1 Jul. 10, 2014

(51) Int. Cl.
*H01L 23/48* (2006.01)
*H01L 23/52* (2006.01)
(Continued)

(52) U.S. Cl.
CPC .......... *H01L 24/81* (2013.01); *H01L 23/49811* (2013.01); *H01L 24/13* (2013.01); *H01L 24/14* (2013.01); *H01L 24/16* (2013.01); *H01L 2224/0345* (2013.01); *H01L 2224/0401* (2013.01); *H01L 2224/05022* (2013.01); *H01L 2224/05124* (2013.01); *H01L 2224/05139* (2013.01); *H01L 2224/05147* (2013.01); *H01L 2224/05572* (2013.01); *H01L 2224/1145* (2013.01); *H01L 2224/1146* (2013.01); *H01L 2224/13005* (2013.01); *H01L 2224/13013* (2013.01); *H01L 2224/13014* (2013.01); *H01L 2224/13082* (2013.01); *H01L 2224/13109* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01); *H01L 2224/14155* (2013.01); *H01L 2224/16237* (2013.01); *H01L 2224/814* (2013.01); *H01L 2224/81024* (2013.01);
(Continued)

(58) Field of Classification Search
CPC ............. H01L 2224/1301; H01L 2224/13012; H01L 2224/13014; H01L 2224/1605; H01L 2224/16052; H01L 2224/16055; H01L 24/14; H01L 24/13; H01L 24/16; H01L 24/17; H01L 2224/13005
USPC ........... 257/737, 773, 692, E23.021; 438/613
See application file for complete search history.

(56) References Cited

U.S. PATENT DOCUMENTS 5,795,818 A     8/1998   Marrs
6,493,238 B1 *   12/2002   Pai ................................ 361/772
(Continued)

*Primary Examiner* — Fernando L Toledo
*Assistant Examiner* — Aaron Gray
(74) *Attorney, Agent, or Firm* — Slater & Matsil, L.L.P.

(57) ABSTRACT

A package structure includes a chip attached to a substrate. The chip includes a bump structure including a conductive pillar having a length (L) measured along a long axis of the conductive pillar and a width (W) measured along a short axis of the conductive pillar. The substrate includes a pad region and a mask layer overlying the pad region, wherein the mask layer has an opening exposing a portion of the pad region. The chip is attached to the substrate to form an interconnection between the conductive pillar and the pad region. The opening has a first dimension (d1) measured along the long axis and a second dimension (d2) measured along the short axis. In an embodiment, L is greater than d1, and W is less than d2.

18 Claims, 4 Drawing Sheets

(51) Int. Cl.
*H01L 29/40* (2006.01)
*H01L 21/44* (2006.01)
*H01L 23/00* (2006.01)
*H01L 23/498* (2006.01)

(52) U.S. Cl.
CPC ............... *H01L 2224/81191* (2013.01); *H01L 2224/81203* (2013.01); *H01L 2224/81385* (2013.01); *H01L 2224/81424* (2013.01); *H01L 2224/81444* (2013.01); *H01L 2224/81447* (2013.01); *H01L 2224/81455* (2013.01); *H01L 2224/81464* (2013.01); *H01L 2224/81484* (2013.01); *H01L 2224/81815* (2013.01); *H01L 2924/1305* (2013.01); *H01L 2924/1306* (2013.01); *H01L 2924/13091* (2013.01)

(56) References Cited

U.S. PATENT DOCUMENTS

| | | |
|---|---|---|
| 8,350,384 B2 | 1/2013 | Pendse |
| 2005/0263884 A1 | 12/2005 | Sawada |
| 2005/0275096 A1 | 12/2005 | Zeng et al. |
| 2007/0152330 A1* | 7/2007 | Wang .............................. 257/737 |
| 2007/0182004 A1* | 8/2007 | Rinne ............................ 257/734 |
| 2011/0006422 A1 | 1/2011 | Daubenspeck et al. |
| 2011/0169158 A1 | 7/2011 | Varanasi |
| 2012/0032322 A1 | 2/2012 | Lin et al. |
| 2012/0098120 A1 | 4/2012 | Yu et al. |
| 2012/0273934 A1* | 11/2012 | Shieh et al. .................... 257/737 |
| 2013/0001769 A1 | 1/2013 | Hou et al. |
| 2013/0026619 A1 | 1/2013 | Chang et al. |
| 2013/0062755 A1 | 3/2013 | Kuo et al. |

\* cited by examiner

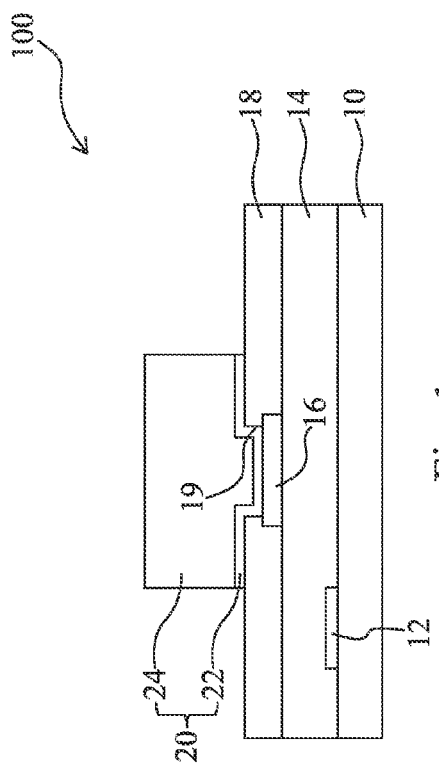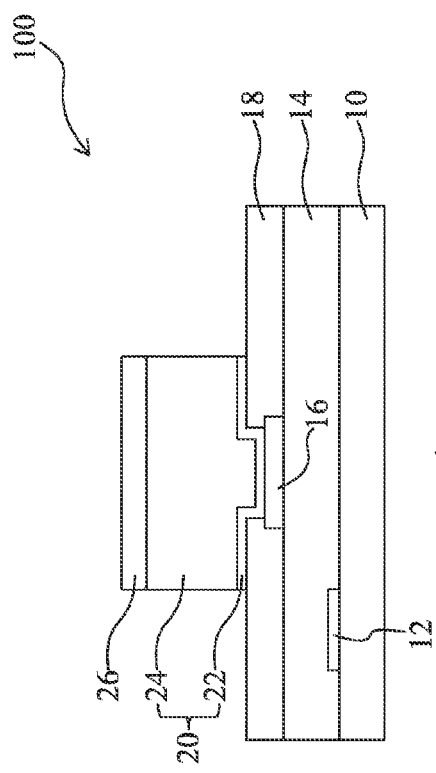

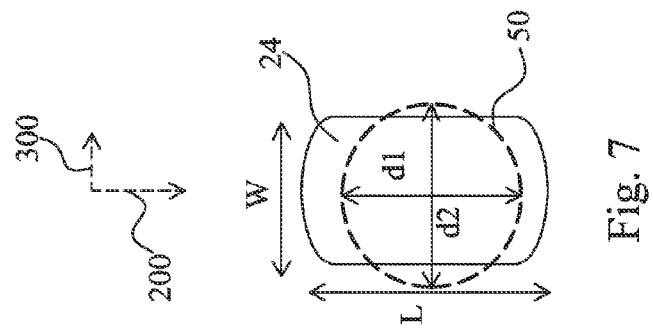
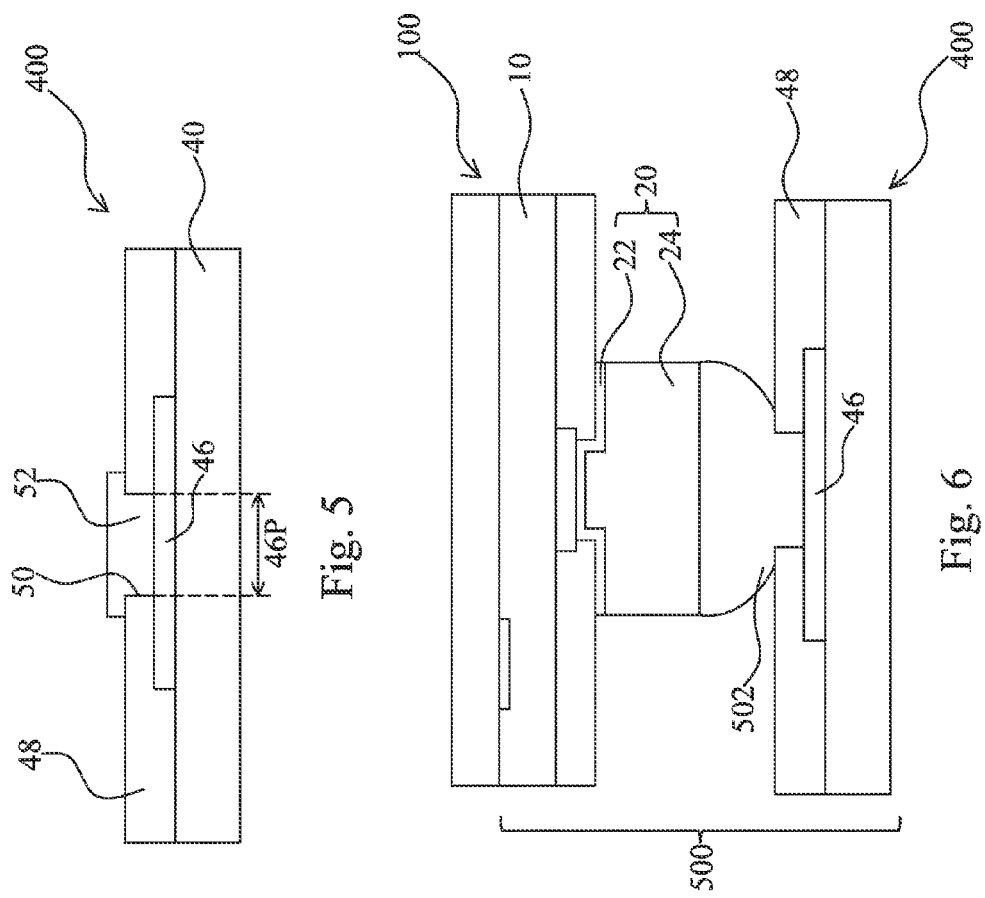

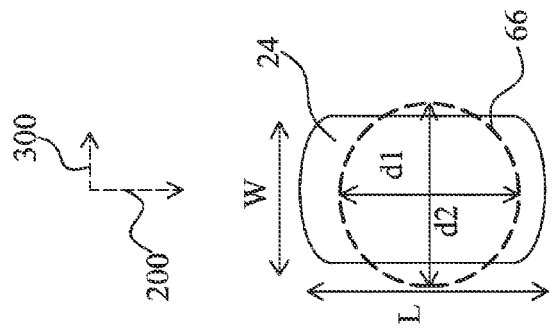
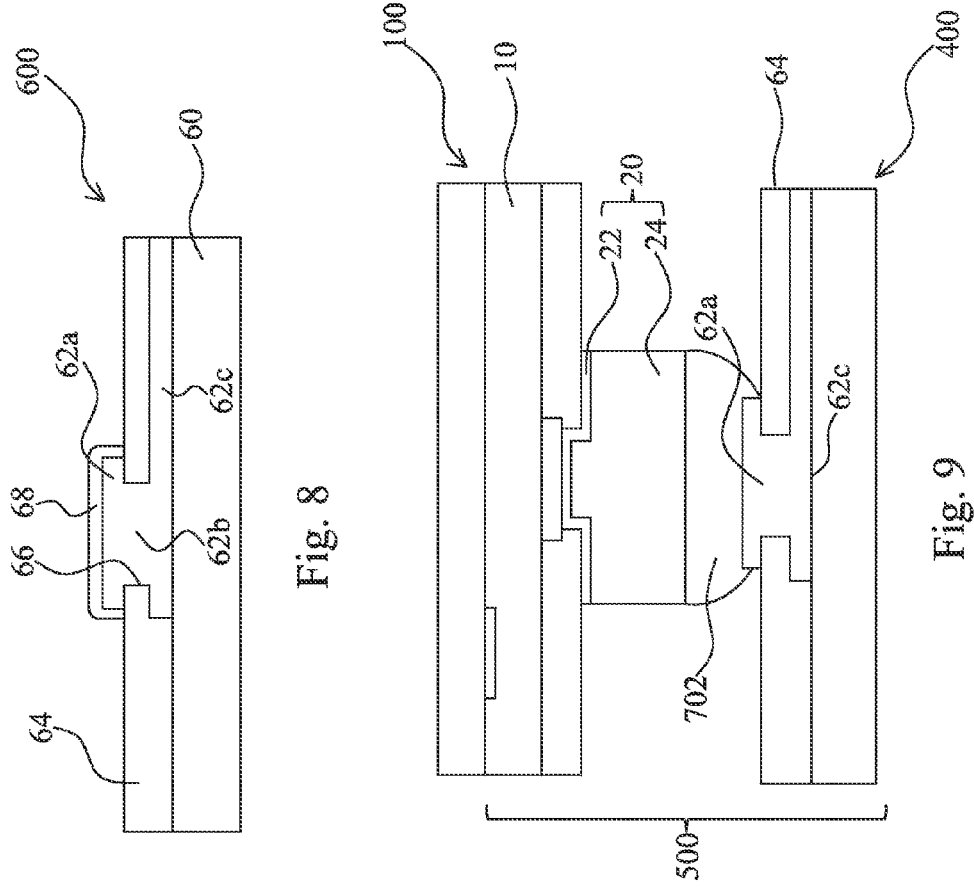

ELONGATED BUMP STRUCTURES IN PACKAGE STRUCTURE

BACKGROUND

Integrated circuit chips comprise semiconductor devices formed on a substrate such as a semiconductor wafer and include metalized contact, or attachment, pads for providing an electrical interface to the integrated circuitry. Bonding bumps are part of the interconnecting structure in an integrated circuitry. A bump provides an interface to an integrated circuit device through which an electrical connection to the device may be made. Conventional techniques for providing a connection between the internal circuitry of a chip and external circuitry, such as a circuit board, another chip, or a wafer, include wire bonding, in which wires are used to connect the chip contact pads to the external circuitry, and may also include other techniques known in the art. A more recent chip connection technique, known as flip chip technology, provides for connection of integrated circuit devices to external circuitry using solder bumps that have been deposited onto the chip contact pads. In order to mount the chip to external circuitry, the chip is flipped over so that its top side faces down and its contact pads are aligned with matching contact pads on the external circuit. The solder is then flowed between the flipped chip and the substrate supporting the external circuitry to complete the interconnection. The resulting flip chip package is much smaller than a traditional carrier-based system, because the chip is positioned directly on the external circuitry, such that the interconnect wires may be much shorter. As a result, the inductance and resistive heat are greatly reduced, enabling higher-speed devices.

Recent trends in high-density flip chip interconnects have led to the use of circular or round-like copper pillar bumps for central processing unit (CPU) and graphics processing unit (GPU) packaging. Copper pillar bumps are attractive replacements for traditional solder bumps, because they provide a fixed stand-off independent of the bonding wire pitch. However, circular copper pillar bumps have several disadvantages. For example, circular shaped copper pillar bumps add significant size to the interconnect structure, thereby limiting the pitch dimension of metal trace lines for the interconnection. As a result, the current circular shaped bumps will eventually become a bottleneck to the continuous device shrinking in the integrated circuit (IC) industry. Another disadvantage to circular copper pillar bumps is the mechanical stress created at the packaging circuitry as well as the underlying layers due to mismatched thermal expansion of the chip and the packaging structure. It has been observed that the stress at the edge of under-bump metallization (UBM) layer is very high after packaging, and thus the induced stress force causes dielectric layer delamination particularly critical in circuitry having extra low-k (ELK) dielectric layers, as the k value is lower than 3. The packaging structure therefore becomes more and more fragile. In addition, the large electrical current density at the circular bump-to-pad interface contributes to electromigration and electric stress. Examples of types of damage from electromigration include micro-racking in solder joints and delamination in bonding layers.

DESCRIPTION OF THE DRAWINGS

FIG. 1 is a cross-sectional view of an elongated bump structure in accordance with one embodiment.

FIG. 2 is a cross-sectional view of an alternative elongated bump structure in accordance with another embodiment.

FIG. 5 is a cross-sectional view of a portion of a work piece in accordance with one embodiment;

FIG. 6 is a cross-sectional view of an exemplary embodiment of a flip-chip package structure comprising a chip attached to a work piece shown in FIG. 5;

FIG. 7 is a top view of the relationship between a mask opening and a conductive pillar of the flip-chip package structure shown in FIG. 6 in accordance with one embodiment;

FIG. 8 is a cross-sectional view of a portion of a work piece in accordance with one embodiment;

FIG. 9 is a cross-sectional view of an exemplary embodiment of a flip-chip package structure comprising a chip attached to a work piece shown in FIG. 8; and FIG. 10 is a top view of the relationship between a mask opening and a conductive pillar of the flip-chip package structure shown in FIG. 9 in accordance with one embodiment.

DETAILED DESCRIPTION

Figure 4:
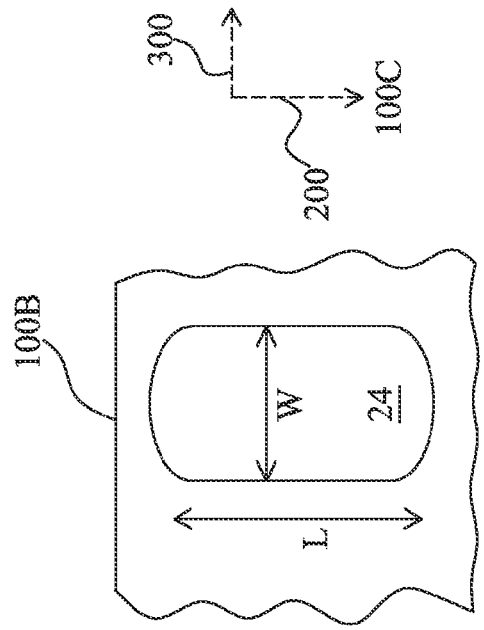
FIG. 4 is an enlarged view of a conductive pillar of an elongated bump structure illustrated in FIG. 3 in accordance with one embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Embodiments described herein relate to the use of elongated bump structures for use with semiconductor devices. As will be discussed below, embodiments are disclosed that utilize an elongated bump structure for the purpose of attaching one substrate to another substrate, wherein each substrate may be a die, wafer, interposer substrate, printed circuit board, packaging substrate, or the like, thereby allowing for die-to-die, wafer-to-die, wafer-to-wafer, die or wafer to interposer substrate or printed circuit board or packaging substrate, or the like. Throughout the various views and illustrative embodiments, like reference numerals are used to designate like elements.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 is a cross-sectional view of an elongated bump structure in accordance with an embodiment.

Referring to FIG. 1, a portion of a chip 100 having electrical circuitry formed in and/or upon a substrate 10 is shown. The substrate 10 may be one of a variety of types of semiconductor substrates commonly employed in semiconductor integrated circuit fabrication, and integrated circuits may be formed therein and/or thereupon. The semiconductor substrate may be of any construction comprising semiconductor materials, including but not limited to, bulk silicon, a semiconductor wafer, a silicon-on-insulator (SOI) substrate, or a silicon germanium substrate. Other semiconductor materials, including group III, group IV, and/or group V semiconductors, may also be used. Although not shown, it will be recognized that the substrate 10 may further comprise a plurality of isolation features, such as shallow trench isolation (STI) features or local oxidation of silicon (LOCOS) features. The isolation features may isolate various microelectronic elements, represented in FIG. 1 by an element 12, formed in and/or upon the substrate 10. Examples of the types of microelectronic elements that may be formed in the substrate 10 include, but are not limited to, transistors such as metal oxide semiconductor field effect transistors (MOSFETs), complementary metal oxide semiconductor (CMOS) transistors, bipolar junction transistors (BJTs), high voltage transistors, high frequency transistors, p-channel and/or n-channel field effect transistors (PFETs/NFETs), resistors, diodes, capacitors, inductors, fuses, and/or other suitable elements. Various processes are performed to form the various microelectronic elements, including but not limited to one or more of deposition, etching, implantation, photolithography, annealing, and other suitable processes. The microelectronic elements are interconnected to form the integrated circuit device, which may comprise one or more of a logic device, memory device (e.g., SRAM), RF device, input/output (I/O) device, system-on-chip (SoC) device, and other suitable types of devices.

The substrate 10 further includes an interconnection structure 14 overlying the integrated circuits. The interconnection structure 14 includes inter-layer dielectric layers and a metallization structure overlying the integrated circuits. The inter-layer dielectric layers in the metallization structure may include one or more of low-k dielectric materials, un-doped silicate glass (USG), silicon nitride (SiN), silicon oxynitride (SiON), and other commonly used materials. The dielectric constants (k value) of the low-k dielectric materials may be less than about 3.9, or less than about 2.8. Metal lines in the metallization structure may be formed of copper or copper alloys. One of ordinary skill in the art will be able to perform the formation of the metallization layers using appropriate processes, and thus details for forming the metallization layer are omitted.

Conductive pads 16 are formed and patterned in or on a top-level inter-layer dielectric layer, which is a portion of conductive routes. The conductive pads 16 comprise contact pads for providing an electrical connection upon which a bump structure, such as a UBM structure or a copper pillar bump, may be formed for facilitating external electrical connections. The conductive pads 16 may be formed of any suitable conductive materials, including one or more of copper (Cu), tungsten (W), aluminum (Al), AlCu alloys, silver (Al), or similar materials, for example. In some embodiments, the conductive pads 16 may be a region or an end of a redistribution line to provide the desired pin or ball layout. One or more passivation layers, such as a passivation layer 18, are formed and patterned over the conductive pads 16 as illustrated in FIG. 1. In one embodiment, openings 19 are provided in the passivation layer 18, exposing underlying portions of the conductive pads 16. In an embodiment, the opening 19 has a diameter larger than the width of the conductive pad 16. In some embodiments, the opening 19 has a diameter equal to, or smaller than the width of the conductive pad 16. In at least one embodiment, the passivation layer 18 is formed of a non-organic material, such as un-doped silicate glass (USG), SiN, SiON, silicon oxide (SiO), or combinations thereof. The passivation layer 18 may be formed by any suitable method, such as chemical vapor deposition (CVD), physical vapor deposition (PVD), or the like. In other embodiments, the passivation layer 18 is formed of a polymer layer, such as an epoxy, polyimide, benzocyclobutene (BCB), polybenzoxazole (PBO), or the like, although other relatively soft, often organic, dielectric materials can also be used. One of ordinary skill in the art will appreciate that a single layer of conductive pads and a passivation layer are shown for illustrative purposes only. As such, other embodiments may include any number of conductive pads and/or passivation layers.

FIG. 1 also illustrates a bump structure 20 formed on the passivation layer 18 and electrically connected to the conductive pad 16 through the opening 19. In accordance with features of embodiments described herein, the shape of the bump structure 20 is an elongated, rather than circular. Various shapes may be used to implement the elongated bump structure, including, but not limited to, a rectangle, a rectangle with at least one curved or rounded side, a rectangle with two convex curved sides, an oval, an ellipse or any other elongated shape.

In an embodiment, the bump structure 20 includes an under-bump-metallurgy (UBM) layer 22 and a conductive pillar 24. The UBM layer 22 is formed over the surfaces of the passivation layer 18 and the exposed portion of the conductive pad 16. In some embodiments, the UBM layer 22 includes a diffusion barrier layer or a glue layer, which may comprise titanium (Ti), tantalum (Ta), titanium nitride (TiN), tantalum nitride (TaN), or the like and be formed by PVD or sputtering. The UBM layer may further include a seed layer formed on the diffusion barrier layer by PVD or sputtering. The seed layer may be formed of copper (Cu) or copper alloys including Al, chromium (Cr), nickel (Ni), tin (Sn), gold (Ag), or combinations thereof. In at least one embodiment, the UBM layer 22 includes a Ti layer and a Cu seed layer.

The conductive pillar 24 is formed on the UBM layer 22. In at least one embodiment, the conductive pillar 24 includes a Cu layer. The Cu layer comprises pure elemental copper, copper containing unavoidable impurities, and/or copper alloys containing minor amounts of elements such as Ta, indium (In), SN, zinc (Zn), manganese (Mn), Cr, Ti, germanium (Ge), strontium (Sr), platinum (Pt), magnesium (Mg), aluminum (Al) or zirconium (Zr). The conductive pillar 24 may be formed by sputtering, printing, electroplating, electro-less plating, electrochemical deposition (ECD), molecular beam epitaxy (MBE), atomic layer deposition (ALD), and/or commonly used CVD methods. In one embodiment, the Cu layer is formed by electro-chemical plating (ECP). In an exemplary embodiment, the thickness of the conductive pillar 24 is greater than 20 μm. In another exemplary embodiment, the thickness of the conductive pillar 24 is greater than 40 μm. For example, the conductive pillar 24 is of about 20~50 μm thickness, or about 40~70 μm thickness, although the thickness may be greater or smaller. In at least one embodiment, the dimension and shape of the conductive pillar 24 are substantially the same as those of the UBM layer 22.

In some embodiments, the dimension and shape of the conductive pillar 24 are not exactly the same as those of the UBM layer 22 because of differences induced by manufacturing process. For example, an undercut of the UBM layer 22.

In alternative embodiments, an optional conductive cap layer is formed on the conductive pillar 24. FIG. 2 is a cross-sectional view of an alternative elongated bump structure in accordance with an embodiment. As previously noted, an optional conductive cap layer 26 may be formed on the top of the conductive pillar 24. The conductive cap layer 26 is a metallization layer that may include nickel (Ni), Sb, tin-lead (SnPb), Au, Ag, palladium (Pd), In, Pt, NiPdAu, NiAu, or other similar materials or alloys. The conductive cap layer 26 may be a multi-layered structure or a single-layered structure. In some embodiments, the conductive cap layer 26 has a thickness about 1~5 µm. In at least one embodiment, the cap layer 26 is a solder layer that may be made of a lead-free solder material, such as Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, SnAgSb, and other similarly appropriate material.

Any suitable processes may be used to form the structures discussed above and will not be discussed in greater detail herein. As one of ordinary skill in the art will realize, while the above description provides a general description of certain features of the embodiments, numerous other features may be present. For example, other circuitry, liners, barrier layers, interconnect metallization configurations, and the like, may be included in the chip. The above description is meant only to provide a context for embodiments discussed herein and is not meant to limit the disclosure or the scope of any claims to those specific embodiments.

Figure 3:
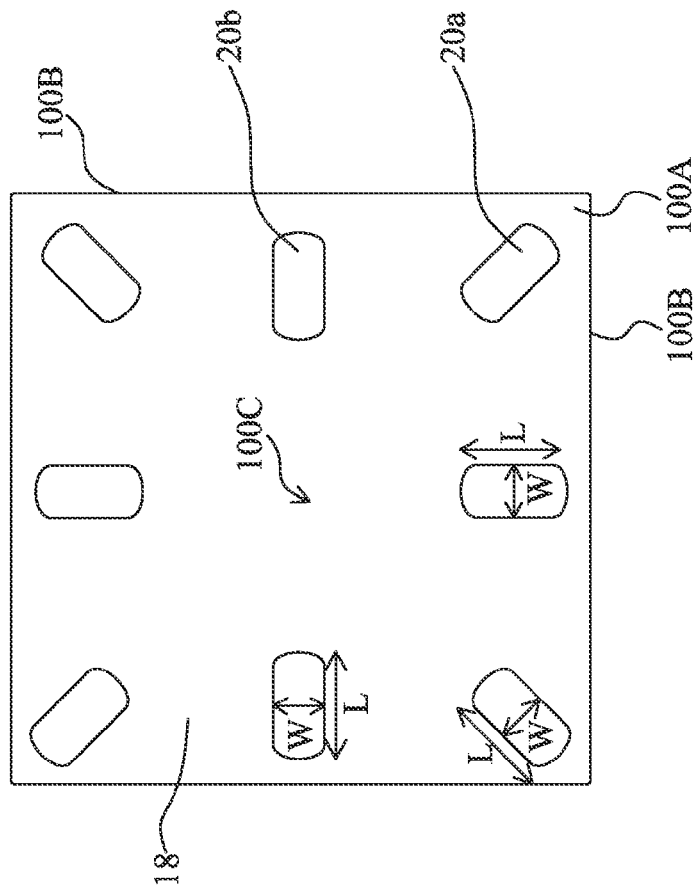
FIG. 3 is a plan view of a plurality of elongated bump structures in accordance with one embodiment disposed on a substrate.

FIG. 3 is a plan view of a portion of the substrate 10 including a plurality of bump structures, such as bump structures 20a, 20b, that are identical to the bump structure 20 described above, formed thereon in accordance with an embodiment. As previously noted, one of any number of various shapes may be used for the elongated bump structures 20a, 20b, including, for example, an oval shape or a rectangular with two rounded sides. The elongated bump structures at the corner area 100A of the chip 100, such as the bump structure 20a, point to a central area 100C of the chip 100 and forming approximately 30~60 degree angles with adjacent chip edges 100B. The elongated bump structures along the chip edges 100B, such as the bump structure 20b, are arranged perpendicularly to the nearest one of the chip edges, which for the bump structure 20b includes one of the edges 100B. Chip peripheral and corner regions typically require minimum pitch, because they often carry higher density interconnects than the power and grounding terminals located at central area 100C. As disclosed, the elongated bump structure array provides tighter pitch and a broader bonding process window than a conventional round pillar array. It should be noted that the various embodiments disclosed herein are described with reference to elongated bump structures located along a chip edge or in a chip corner for illustrative purposes only. Other embodiments may utilize aspects with bump structures disposed along interior portions of the chip. It should also be noted that the placement of the elongated bump structures is provided for illustrative purposes only and that the specific locations and patterns of the bump structures may vary and may include, for example, an array of bumps, lines of bumps in a middle region of the chip, staggered bumps, or the like. The illustrated chip and bump sizes are provided for reference only and are not intended to be actual sizes or actual relative sizes.

FIG. 4 is an enlarged view of the conductive pillar 24 of the elongated bump structure 20 in accordance with an embodiment. The elongated bump structure 20 is composed of the UBM layer 22 and the conductive pillar 24. In an embodiment, the conductive pillar 24 with an elongated shape has a length L and a width W, wherein L represents a length measured along a long axis 200 of the conductive pillar 24, and W represents a length measure along a short axis 300 of the conductive pillar 24. The short axis 300 is perpendicular to the long axis 200. Varied with the placement of the bump structure array on the substrate 10, in some embodiments, the long axis 200 is along a direction toward the central area 100C of the chip 100. For example, the long axis 200 is perpendicular to the chip edge 100B, or the long axis 200 forms about 30~60 degree angles with the adjacent chip edges 100B.

The chip 100 with the elongated bump structures 20 will be attached to a work piece, such as a package substrate, a printed circuit board (PCB), a translation pad flip chip (TPFC) substrate, an interposer, a wafer or another chip using wafer-level or die-level stacking and the like. For example, embodiments may be used in a die-to-die bonding configuration, a die-to-wafer bonding configuration, a wafer-to-wafer bonding configuration, die-level packaging, wafer-level packaging, or the like. The elongated bump structures 20 may subsequently be connected to a metal trace on the work piece through an opening of a mask layer.

FIG. 5 is a cross-sectional diagram showing a portion of a work piece 400 to which a chip, such as the chip 100, will be attached. FIG. 6 is a cross-sectional diagram depicting an exemplary embodiment of a flip-chip package structure formed by attaching the chip 100 to the work piece 400.

Referring to FIG. 5, a portion of the work piece 400 includes a substrate 40, which may be a package substrate, a PCB, a wafer, a die, an interposer substrate, a dielectric substrate, or other suitable substrate. The substrate 40 includes a plurality of conductive traces electrically connected to underlying metal interconnection. Some areas of the conductive traces are defined as landing pad regions 46 for electrically connecting to the elongated bump structures 20. The landing pad regions 46 may be formed of substantially pure Cu, AlCu, or other metallic materials such as W, Ni, Pd, Au, and alloys thereof. In an embodiment, a mask layer 48 is formed and patterned on the substrate 40 to cover portions of the conductive traces 46. In at least one embodiment, mask openings 50 are formed in the mask layer 48 to expose portions of the landing pad regions 46P, respectively. The mask layer 48 may be formed of a solder resist material layer, a dielectric layer, a polymer layer, or any other materials without chemically reacting with solder materials. The mask layer 48 with the mask openings 50 provides a window for solder jointing bump structures on other substrate. For example, a solder layer 52 including alloys of Sn, Pb, Ag, Cu, Ni, bismuth (Bi), or combinations thereof is provided in the mask opening 50.

The chip 100 as shown in either FIG. 1 or FIG. 2 may be flipped upside down and attached to the work piece 400 as shown in FIG. 5 through flip-chip bonding technologies so as to form a package structure 500 as shown in FIG. 6. An exemplary coupling process includes a flux application, chip placement, reflowing of melting solder joints, and/or cleaning of flux residue. A high temperature process, such as reflow or thermal compression bonding, may be performed to melt the solder layer 52 on the substrate 40 and/or the solder layer 26 on substrate 10. The melted solder layer thus joins the chip 100 and the work piece 400 together and electrically connects the elongated bump structure 20 to the landing pad region 46P. A reflowed region 502 formed by melting the solder layer is hereinafter referred to as a solder joint region. The conductive pillar 24 electrically connects to the landing pad region 46P and thus forms an interconnection in the package structure 500. After the solder jointing, a mold underfill (not shown) may be filled into the space between chip 100 and work piece 400, and thus the mold underfill is also filled into the space between neighboring conductive traces. Alternatively, no mold underfill is provided in the package structure 500.

FIG. 7 is an enlarged top view of the relationship of the mask opening 50 and the conductive pillar 24 in the resulting structure as shown in FIG. 6 in accordance with an embodiment. The conductive pillar 24 has the length L measured along its long axis 200, and a width W measured along its short axis 300. The length L is greater than the width W. In one embodiment, the length L is about 70~150 μm, and the width W is about 40~100 μm. The mask opening 50 has a first dimension d1 measured along the long axis 200 of the conductive pillar 24, and a second dimension d2 measured along the short axis 300 of the conductive pillar 24. Various shapes may be used for the mask opening 50, for example, a circle, a polygon, or another shape with radial symmetry. In one embodiment, the first dimension d1 is equal to the second dimension d2. In another embodiment, the first dimension d1 is greater than the second dimension d2. In the other embodiment, the first dimension d1 is less than the second dimension d2. For example, the first dimension d1 is about 50~90 μm, and the second dimension d2 is about 50~90 μm.

The present embodiments exhibit dimensions/characteristics that provide a bump structure having a geometry designed to increase joint reliability and reduce bump fatigue. In at least one embodiment, the length L, the width W, the first dimension d1, and the second dimension d2 are related to one another by the following relationship: L>d1, and d2>W. In some embodiments, the difference between the length L and the first dimension d1 is greater than about 20 μm. For example, L−d1>30 μm. In some embodiments, the difference between the width W and the second dimension d2 is about 2 μm. For example, d2−W>4 μm. Embodiments such as those disclosed herein may be achieved by decreasing the width W of the conductive pillar 24, such that the space between two adjacent conductive pillars 24 on the chip 100 can be increased and the bump density becomes lower. The present embodiments can meet the requirements of better bridge window for molding process and lower process costs. From simulation data, it is observed that the bump structure using the design L/d1/W of 112 μm/70 μm 65 μm can cause the ELK stress with 15% reduction and the PSC (pre-solder crack) stress with 18% reduction compared with another bump structure using the design L/d1/W of 100 μm 70 μm/78 μm.

In some embodiments, the chip 100 with the elongated bump structures 20 will be attached to an alternative work piece, such as a translation pad flip chip (TPFC) substrate. FIG. 8 is a cross-sectional diagram showing a portion of a TPFC substrate. FIG. 9 is a cross-sectional diagram depicting an exemplary embodiment of a flip-chip package structure 700 formed by attaching the chip 100 to the TPFC substrate.

Referring to FIG. 8, a work piece 600 is a TPFC substrate in accordance with some embodiments. A portion of the work piece 600 includes a substrate 60, a plurality of conductive regions 62 electrically connected to underlying metal interconnection. Some areas of the conductive regions 62 are defined as pad regions including top pad regions 62a, via regions 62b and bottom pad region 62c for electrically connecting to the elongated bump structures 20. In an embodiment, a mask layer 64 is formed and patterned on the substrate 60 to cover portions of the conductive regions 62, in which the bottom pad regions 62c are formed inside the mask layer 64 and the top pad regions 62a protrude from the top surface 64s of the mask layer 64. In at least one embodiment, mask openings 66 are formed in the mask layer 64, and the conductive regions 62 fill the openings 66 to form the via regions 62b for connecting the pad regions 62a and 62c. The conductive regions 62 may be formed of substantially pure Cu, AlCu, or other metallic materials such as W, Ni, Pd, Au, and alloys thereof. The mask layer 64 may be formed of a solder resist material layer, a dielectric layer, a polymer layer, or any other materials without chemically reacting with solder materials. A solder layer 68 is provided on the top pad region 62a for solder jointing bump structures on other substrate. For example, the solder layer 68 includes alloys of Sn, Pb, Ag, Cu, Ni, bismuth (Bi), or combinations thereof.

The chip 100 as shown in either FIG. 1 or FIG. 2 may be flipped upside down and attached to the work piece 600 as shown in FIG. 8 through flip-chip bonding technologies so as to form a package structure 700 as shown in FIG. 9. An exemplary coupling process includes a flux application, chip placement, reflowing of melting solder joints, and/or cleaning of flux residue. A high temperature process, such as reflow or thermal compression bonding, may be performed to melt the solder layer 68 on the substrate 60 and/or the solder layer 26 on substrate 10. The melted solder layer thus joins the chip 100 and the work piece 600 together and electrically connects the elongated bump structure 20 to the top pad region 62a. A reflowed region 702 formed by melting the solder layer is hereinafter referred to as a solder joint region 702. The conductive pillar 24 electrically connects to the top pad region 62a and thus forms an interconnection in the package structure 700.

FIG. 10 is an enlarged top view of the relationship of the mask opening 66 and the conductive pillar 24 in the resulting structure as shown in FIG. 9 in accordance with an embodiment. The conductive pillar 24 has the length L measured along its long axis 200, and a width W measured along its short axis 300. The length L is greater than the width W. In one embodiment, the length L is about 70~150 μm, and the width W is about 40~100 μm. The mask opening 66 has a first dimension d1 measured along the long axis 200 of the conductive pillar 24, and a second dimension d2 measured along the short axis 300 of the conductive pillar 24. Various shapes may be used for the mask opening 66, for example, a circle, a polygon, or another shape with radial symmetry. In one embodiment, the first dimension d1 is equal to the second dimension d2. In another embodiment, the first dimension d1 is greater than the second dimension d2. In the other embodiment, the first dimension d1 is less than the second dimension d2. For example, the first dimension d1 is about 50~90 μm, and the second dimension d2 is about 50~90 μm.

The present embodiments exhibit dimensions/characteristics that provide a bump structure having a geometry designed to increase joint reliability and reduce bump fatigue. In at least one embodiment, the length L, the width W, the first dimension d1, and the second dimension d2 are related to one another by the following relationship: L>d1, and d2>W. In some embodiments, the difference between the length L and the first dimension d1 is greater than about 20 μm. For example, L−d1>30 μm. In some embodiments, the difference between the width W and the second dimension d2 is about 2 μm. For example, d2−W>4 μm.

In accordance with one aspect of the exemplary embodiment, a package structure includes a chip attached to a substrate. The chip includes a bump structure including a conductive pillar having a length (L) measured along a long axis of the conductive pillar and a width (W) measured along a short axis of the conductive pillar. The substrate includes a pad region and a mask layer overlying the pad region, wherein the mask layer has an opening exposing a portion of the pad region. The chip is attached to the substrate to form an interconnection between the conductive pillar and the pad region. The opening has a first dimension (d1) measured along the long axis and a second dimension (d2) measured along the short axis. In an embodiment, L is greater than d1, and W is less than d2.

In accordance with one aspect of the exemplary embodiment, a package structure includes a chip attached to a substrate. The chip includes a bump structure including a conductive pillar having a length (L) measured along a long axis of the conductive pillar and a width (W) measured along a short axis of the conductive pillar. The substrate includes a mask layer having an opening, and a conductive region filling the opening of the mask layer and protruding from the top surface of the mask layer. The chip is attached to the substrate to form an interconnection between the conductive pillar and the conductive region. The opening has a first dimension (d1) measured along the long axis and a second dimension (d2) measured along the short axis. In an embodiment, L is greater than d1, and W is less than d2.

In accordance with one aspect of the exemplary embodiment, a method of forming a package structure, including: forming a bump structure on a semiconductor substrate, wherein the bump structure comprises a conductive pillar having a length (L) measured along a long axis of the conductive pillar and a width (W) measured along a short axis of the conductive pillar; forming a solder resist layer on a package substrate which having a pad region, forming an opening in the solder resist layer, wherein the opening has a first dimension (d1) measured along the long axis and a second dimension (d2) measured along the short axis, and wherein L is greater than d1, and W is less than d2; and attaching the chip to the package substrate to form an interconnection between the conductive pillar and the pad region.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A package structure, comprising:
  a chip comprising a bump structure, wherein the bump structure comprises a conductive pillar having a length (L) measured along a long axis of the conductive pillar and a width (W) measured along a short axis of the conductive pillar, wherein L is different from W, wherein the bump structure further comprises an under bump metallurgy layer; and
  a substrate comprising a pad region and a mask layer overlying the pad region, wherein the mask layer has an opening exposing a portion of the pad region,
  wherein the conductive pillar of the chip is attached to the pad region of the substrate via a solder joint region to form an interconnection between the conductive pillar and the pad region,
  wherein the solder joint region contacts a center of a major top surface of the conductive pillar along the long axis of the conductive pillar,
  wherein the opening has a first dimension (d1) measured along the long axis and a second dimension (d2) measured along the short axis; and
  wherein L is greater than d1, and W is less than d2.

2. The package structure of claim 1, wherein the mask layer is formed of a solder resist material layer.

3. The package structure of claim 1, wherein the conductive pillar comprises copper or copper alloy.

4. The package structure of claim 1, wherein the long axis of the conductive pillar is perpendicular to an edge of the chip.

5. The package structure of claim 1, wherein the long axis of the conductive pillar is along a direction toward a central area of the chip.

6. The package structure of claim 1, wherein the difference between L and d1 is greater than 20 μm.

7. The package structure of claim 1, wherein the difference between d2 and W is greater than 2 μm.

8. The package structure of claim 1, wherein d1 is substantially equal to d2.

9. A package structure, comprising:
  a chip comprising a bump structure, wherein the bump structure comprises a conductive pillar having a length (L) measured along a long axis of the conductive pillar and a width (W) measured along a short axis of the conductive pillar, wherein the bump structure further comprises an under bump metallurgy layer; and
  a substrate comprising a mask layer overlying the substrate and having an opening, and a conductive region filling the opening of the mask layer and protruding from a top surface of the mask layer;
  wherein the conductive pillar of the chip is attached to the conductive region of the substrate through a solder joint region to form an interconnection between the conductive pillar and the conductive region,
  wherein the solder joint region contacts a center of a major top surface of the conductive pillar along the long axis of the conductive pillar,
  wherein the opening has a first dimension (d1) measured along the long axis and a second dimension (d2) measured along the short axis; and
  wherein L is different from W, L is greater than d1, and W is less than d2.

10. The package structure of claim 9, wherein the mask layer is formed of a solder resist material layer.

11. The package structure of claim 9, wherein the conductive pillar comprises copper or copper alloy.

12. The package structure of claim 9, wherein the long axis of the conductive pillar is perpendicular to an edge of the chip.

13. The package structure of claim 9, wherein the long axis of the conductive pillar is along a direction toward a central area of the chip.

14. The package structure of claim 9, wherein the difference between L and d1 is greater than 20 μm.

15. The package structure of claim 9, wherein the difference between d2 and W is greater than 2 μm.

16. The package structure of claim 9, wherein d1 is substantially equal to d2.

17. A method of forming a package structure, comprising:
  forming a bump structure on a semiconductor device, wherein the bump structure comprises a conductive pillar having a length (L) measured along a long axis of the conductive pillar and a width (W) measured along a short axis of the conductive pillar, L being different from W, wherein the bump structure further comprises an under bump metallurgy layer;
  forming a solder resist layer on a package substrate having a pad region, forming an opening in the solder resist layer, wherein the opening has a first dimension (d1) measured along the long axis and a second dimension (d2) measured along the short axis, and wherein L is greater than d1, and W is less than d2; and attaching the conductive pillar of the semiconductor device to the pad region of the package substrate via a solder joint region to form an interconnection between the conductive pillar and the pad region, the solder joint region contacting a center of a major top surface of the conductive pillar along the long axis of the conductive pillar.

18. The method of claim 17, further comprising forming a solder layer on at least one of the conductive pillar and the pad region.

\* \* \* \* \*